(12) United States Patent
Yu et al.

(10) Patent No.: US 8,064,278 B2
(45) Date of Patent: Nov. 22, 2011

(54) PROTECTION REGISTER FOR A NON-VOLATILE MEMORY

(75) Inventors: Chin-Tin Tina Yu, Folsom, CA (US); Rich E. Fackenthal, Carmichael, CA (US); Duane Mills, Shingle Springs, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 340 days.

(21) Appl. No.: 12/346,701

(22) Filed: Dec. 30, 2008

(65) Prior Publication Data

US 2010/0165765 A1      Jul. 1, 2010

(51) Int. Cl.
*G11C 7/00* (2006.01)
(52) U.S. Cl. .................... 365/200; 365/201; 365/163
(58) Field of Classification Search .................. 365/200, 365/201, 163
See application file for complete search history.

(56) References Cited

U.S. PATENT DOCUMENTS

| | | | | |
|---|---|---|---|---|
| 6,614,685 | B2* | 9/2003 | Wong | 365/185.11 |
| 2002/0001233 | A1* | 1/2002 | Hotaka | 365/189.04 |
| 2004/0080988 | A1* | 4/2004 | Harari et al. | 365/200 |
| 2008/0019195 | A1* | 1/2008 | Ooishi et al. | 365/189.15 |

* cited by examiner

*Primary Examiner* — Vu Le
*Assistant Examiner* — Han Yang
(74) *Attorney, Agent, or Firm* — Lisa K. Jorgenson; Jeremiah J. Baunach; Seed IP Law Group PLLC (57) ABSTRACT

A non-volatile memory including a plurality of memory cells configured to store data and a plurality of redundant memory cells configured to be used for functionally replacing defective memory cells. The memory further includes a protection register comprising storage elements configured to store configuration data of the memory device. The storage elements of the protection register are redundant memory cells not being used to replace defective memory cells.

21 Claims, 3 Drawing Sheets

PROTECTION REGISTER FOR A NON-VOLATILE MEMORY

BACKGROUND

1. Technical Field

The present disclosure relates to the integrated memories field. Particularly, the present disclosure regards protection registers for non-volatile memories.

2. Description of the Related Art

Non-volatile memory is a type of memory that can retain the stored information even when not powered. Just to mention a few examples, known non-volatile memories include erasable and programmable read-only memories, flash memories, and phase change memories. Such devices generally have one or more memory blocks formed by memory arrays of storage elements, referred to as memory cells; typically, the memory cells of an array are arranged in rows and columns, associated with corresponding word lines and bit lines, respectively.

Most modern non-volatile memories require to store configuration data in a way which is not freely accessible to the end user. Such configuration data may include factory device identifiers, manufacturing information, data that can increase system security or prevent device substitution—such as passwords and/or encryption and decryption keys—, test information, and any data that needs to be permanently locked to prevent user alteration.

For this purpose, known non-volatile memory devices are provided with so called protection registers. A protection register is a dedicated memory register that is not freely accessible to the end user, the data stored therein being readable—and modifiable—only under certain conditions, for example together with the provision of a correct sequence of dedicated commands and correct passwords. A protection register may be used to directly store the data that are to be rendered inaccessible to the end user. Moreover, a protection register may be used to store information about the reading/writing/erasing rights given to an end user towards specific portions of the memory arrays of the memory device; for example, portions of one or more memory arrays may be associated with a corresponding bit stored in the protection register, whose value determines if the memory cells of said portions are freely accessible—e.g., in reading—or not by an end user. In this way, it is possible to "lock" the information stored in certain portions of the memory arrays of the memory device, protecting them from unauthorized accesses.

Known protection registers for non-volatile memories are implemented by means of storage elements, referred to as protection memory cells, which are arranged in a dedicated mini-array separated from the other memory arrays forming the memory blocks. Moreover, the protection memory cells of such mini-arrays are not of the same type of the memory cells forming the memory arrays. Indeed, in order to lock the protection register so that the data stored therein may not be overwritten, the protection memory cells are typically of the one-time programmable type. Unlike a memory cell of the memory array, which can be reprogrammed a high number of times—e.g., a memory cell of a modern single-level NAND flash memory can be subjected to up to 100,000 program cycles—, a one-time programmable memory cell can be programmed only once. The programming typically involves the "blowing" of a fuse element of the memory cell, such as a thin gate oxide MOS transistor; in this way, the programming of a one-time programmable memory is irreversible.

Because of the area required for integrating such fuse elements is decidedly higher than that required for integrating a normal memory cell, the number of protection memory cells forming a one-time programmable protection register needs to be kept as small as possible. This constraint negatively affects the amount of data that can be stored in the protection register.

Moreover, in order to read and/or program the protection registers, the one-time programmable memory cells requires dedicated read and write circuits, which are different from the ones used for reading and writing data from/into the memory cells forming the memory arrays.

Furthermore, the manufacturing techniques used to form such on-time programmable memory cells are quite different from the standard processes used to integrate the normal memory cells, thereby increasing the complexity and the cost of the whole non-volatile memory device.

BRIEF SUMMARY

In view of the above the Applicant has tackled the problem of improving the known solutions for implementing protection registers for non-volatile memories.

One embodiment provides a non-volatile memory including a plurality of memory cells configured to store data and a plurality of redundant memory cells configured to be used for functionally replacing defective memory cells. The memory further includes a protection register comprising storage elements configured to store configuration data of the memory device. The storage elements of the protection register are redundant memory cells being not used to replace defective memory cells.

One embodiment provides a corresponding method.

One embodiment provides an electronic system including at least one non-volatile memory.

BRIEF DESCRIPTION OF THE SEVERAL VIEWS OF THE DRAWINGS

The invention itself, as well as further features and the advantages thereof, will be best understood with reference to the following detailed description, given purely by way of a non-restrictive indication, to be read in conjunction with the accompanying drawings. Particularly.

DETAILED DESCRIPTION

In the following, a solution according to exemplary and non-limitative embodiments will be presented and described in detail. Those skilled in the art will however recognize that several modifications to the described embodiments are possible.

Figure 1:
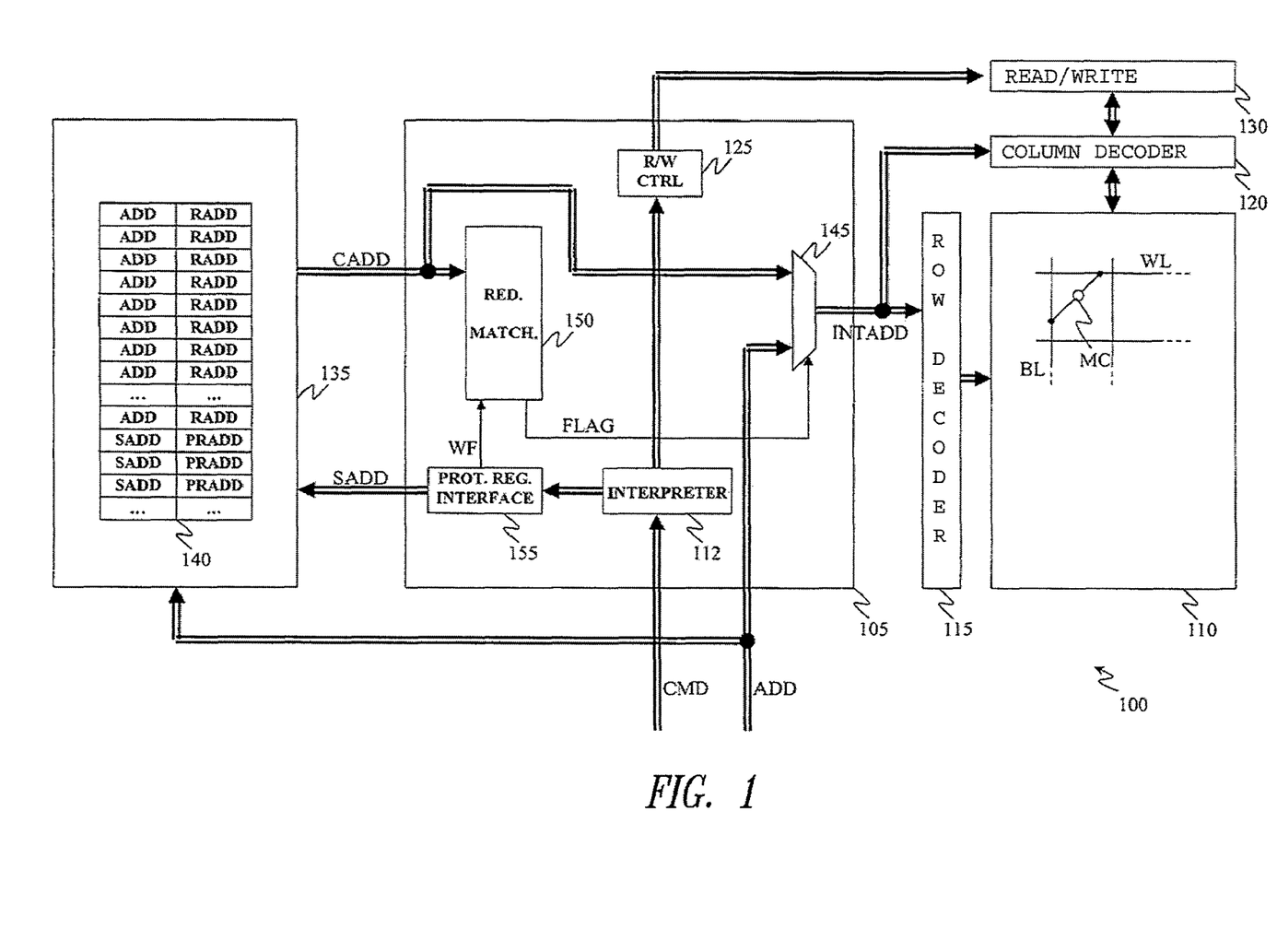
FIG. 1 schematically illustrates a non-volatile memory according to an embodiment.

FIG. 1 schematically illustrates a non-volatile memory 100 according to an embodiment.

The non-volatile memory 100 comprises a main logic block 105 and a memory array 110 comprising a plurality of non-volatile memory cells MC arranged in rows and columns. The memory 100 includes a plurality of bit lines BL, each one associated with a column of the memory array 110, and a plurality of word lines WL, each one associated with a row of the memory array 110.

The main logic block 105 is configured to manage operations to be performed on the memory cells of the memory array 110 in response to commands CMD and addresses ADD received from the outside of the memory. For this purpose, the main logic block 105 comprises a command interpreter circuit 112 configured to receive the commands CMD and accordingly determine an operation (for example, a reading or a writing operation) to be performed on selected memory cells of the memory array 110 identified by the specific address ADD.

In response to the received address ADD, the main logic block 105 generates an internal address INTADD (this process will be described in detail in the following of the present description); the internal address INTADD is sent to a row decoder 115 and to a column decoder 120, which accordingly select at least one word line WL and a group of bit lines BL, respectively.

Moreover, the main logic block 105 includes a read and write control circuit—schematically identified in the figure with the reference 125—that is configured to drive a read and write circuit 130 on the basis of the command CMD interpreted by the command interpreter circuit 112. The read and write circuit 130 includes all the components (such as sense amplifiers, comparators, charge pumps, reference cells, pulse generators, and the like), which are used to program the memory cells MC corresponding to the selected word lines WL and bit lines BL, or to read their values.

According to an exemplary embodiment, the memory 100 is a phase-change memory. In this case, each memory cell MC is made of a phase-change material; typically, the phase-change material consists of a chalcogenide (such as an alloy $Ge_2Sb_2Te_5$). Without descending to particulars well known in the art, the phase-change material can be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, "0"), whereas the material in the crystalline phase has a low resistivity (defining a set state associated with a second logic value, for example, "1"). It has to be appreciated that the present invention is in no way limited to the phase change memories, the concept thereof being applicable to any non-volatile memory.

Figure 2:
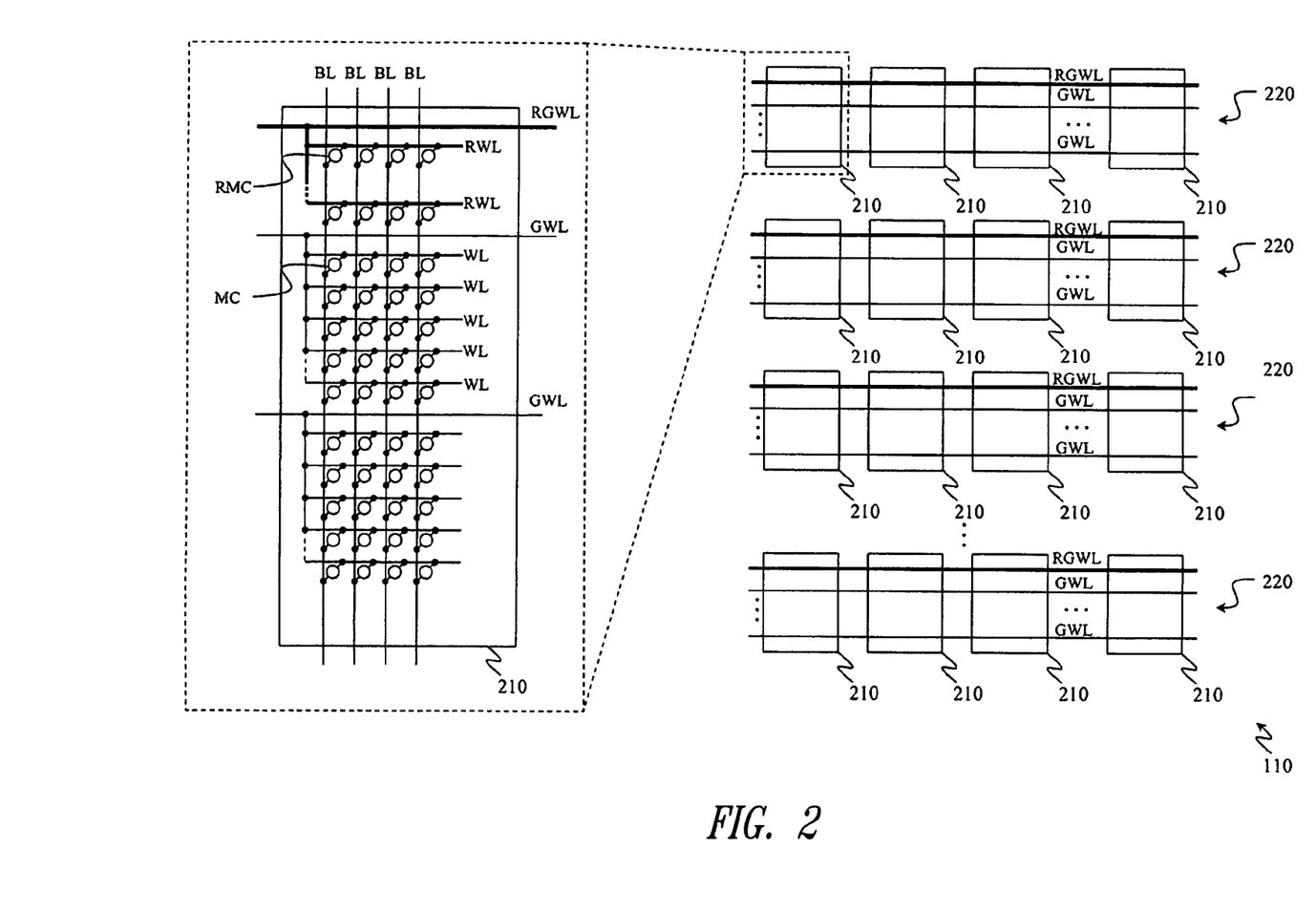
FIG. 2 illustrates an example of how memory cells of a memory array included in the memory of FIG. 1 may be arranged.

FIG. 2 illustrates in greater detail an example of how the memory cells MC of the memory array 110 may be arranged. According to this example, the whole memory array 110 is subdivided into a plurality of so-called tiles, identified in figure with the reference 210. Each tile 210 includes a respective group of memory cells MC arranged in rows and columns. The tiles 210 are arranged according to a matrix layout, with the tiles 210 of a same row of said matrix defining a so-called plane 220. In the example at issue, the memory array 110 includes sixteen planes 220, each one comprising eight respective tiles 210. The tiles 210 belonging to a same plane 220 share a group of common global word lines, identified with the reference GWL. In the example considered, the tiles 210 of a plane 220 share 64 global word lines GWL. Each global word line GWL is connected to a respective packet of (local) word lines WL in each tile 210 that shares said global word line GWL; for example, each packet may include sixteen word lines WL. Moreover, according to this example, each tile 210 is also associated with a respective packet of bit lines BL. A generic memory cell MC included in a tile 210 is coupled with a respective one among the bit lines BL associated with the tile 210 and a respective one among the word lines WL belonging to a packet of word lines WL of said tile 210.

Considering now FIG. 1 together with FIG. 2, the selection of memory cells MC to be subjected to a specific operation—such as a reading or a writing one—may be performed by the row decoder 115 and the column decoder 120 through the selection of a word line WL and of a bit line BL per each tile 210 of a plane 220. In detail, according to the internal address INTADD generated by the main logic block 105, the row decoder 115 selects a global word line GWL associated with a plane 220 and a corresponding word line WL selected from the packets connected thereto in each tile 210, biasing them with a voltage having a value that depends on the operation to be performed. Moreover, still according to the internal address INTADD, the column decoder 120 selectively connects one bit line BL per each tile 210 of the plane 220 associated with the selected global word line GWL to the read and write circuit 130. In this way, each reading and writing operation is performed by accessing a group of memory cells MC at a time.

In addition to the global word lines GWL and the (local) word lines WL, the memory array 110 comprises a plurality of redundant global word lines RGWL, each one shared by the tiles 210 of a respective plane 220. Each redundant global word line RGWL is connected to a respective packet of (local) redundant word lines RWL in each tile 210 that shares said redundant global word line RGWL; for example, each packet may include six redundant word lines RWL.

The redundant word lines RWL are connected to redundant memory cells RMC, configured to be used for replacing possible defective memory cells MC. Indeed, as it is well known to those skilled in the art, some of the memory cells MC of the memory array 110 may present defects caused by imperfections in the fabrication process.

As a consequence, when the memory 100 is being manufactured, a test is usually performed for determining whether or not some of the memory cells MC are defective; depending on the extent of the defects, single memory cells MC, groups of memory cells MC or even entire rows or column of memory cells MC may be replaced by respective redundant memory cells RMC.

According to solutions well known to the skilled technicians, modern integrated memory devices are conventionally provided with a specific redundancy control circuitry, which is capable of storing the addresses identifying the defective memory cells which have been functionally replaced by redundant memory cells. Briefly, each time a new address is received by the memory, the redundancy control circuitry compares the received address to the stored addresses, so as to establish whether the received address corresponds to defective memory cells. If the memory cells corresponding to the received address are not defective, they are normally accessed, with the decoder and selector circuits that are driven by said address. On the contrary, if the memory cells corresponding to the received address are defective, the decoders and selector circuits are driven by the address identifying the redundant memory cells that functionally replace the defective memory cells.

For this purpose, the memory 100 is provided with a redundancy control block 135 that includes a one-time programmable content-addressable memory (CAM) 140 configured to store the addresses ADD identifying the defective memory cells MC which have been functionally replaced by redundant memory cells RMC. In order to read and program the CAM

140, the redundancy control block 135 comprises dedicated read and write circuits, which are not depicted in the figure.

After that the test operations have been performed, the addresses ADD of the memory cells MC that have been assessed to be defective are stored in respective entries of the CAM 140. Then, each of said stored addresses ADD corresponding to a respective group of defective memory cells MC is associated with a respective redundancy address RADD—which is stored in the CAM, too—, corresponding to a respective group of redundant memory cells RMC that have been chosen for functionally replacing said group of defective memory cells.

During the operation of the memory 100, every time that a group of memory cells MC corresponding to a specific address ADD have to be accessed for the execution of an operation (specified by the command CMD), said address ADD is also input to the redundancy control block 135. The redundancy control block 135 checks whether the CAM 140 has an entry storing the specific value of said received address ADD or not.

In the affirmative case, i.e., if the received address ADD matches one of the addresses ADD stored in the CAM 140, the redundancy control block 135 outputs a CAM address CADD having a value that corresponds to the redundancy address RADD associated with the address ADD. The CAM address CADD is provided to the main logic block 105, so that the operation directed to the (defective) memory cells MC identified by the address ADD are performed on the redundant memory cells RMC identified by the redundancy address RADD.

In the negative case, the redundancy control block 135 does not have to interfere with the operation of the main logic block 105, because this means that the address ADD corresponds to memory cells MC that are not defective.

In detail, the CAM address CADD is provided to a first input of a multiplexer 145 included in the main logic block 105; the multiplexer 145 has a second input configured to receive the address ADD from the output of the memory 100, a control input configured to receive a flag signal FLAG and an output configured to provide the internal address INTADD to the row decoder 115 and to the column decoder 120. As will be described in the following, the internal address INTADD may be set to the CAM address CADD or to the address ADD based on the value assumed by the flag signal FLAG.

The flag signal FLAG is generated by a redundancy matching block 150 (included in the main logic block 105) which is coupled with the redundancy control block 135 for receiving the CAM address CADD. During the operation of the memory 100, if the redundancy control block 135 outputs a CAM address CADD in response to a specific address ADD, the redundancy matching block 150 drives the flag signal FLAG in such a way that the internal address INTADD is set to the CAM address CADD by the multiplexer 145; conversely, if the redundancy control block 135 does not output any CAM address CADD in response to the address ADD, the redundancy matching block 150 drives the flag signal FLAG in such a way that the internal address INTADD is set to the address ADD.

In this way, if the memory 100 has to perform operations—e.g., reading or writing operations—directed to addressed memory cells MC that are defective, the row decoder 115 and the column decoder 120 are advantageously driven by the redundancy address RADD that identifies the redundant memory cells RMC functionally replacing said defective memory cells.

It has to be appreciated that the CAM memory 140 included in the redundancy control block 135 is a one-time programmable memory, whose memory cells are provided with fuse elements configured to be permanently fused so that the programming of the addresses ADD—and of the associated redundancy addresses RADD—performed after the test operation is irreversible.

As already mentioned in the portion of the present document describing the prior art, the area required for integrating a one-time programmable memory is decidedly higher than that required for integrating a normal memory cell MC of the memory array 110. Therefore, the number of entries in the CAM memory 140 configured to store the addresses ADD (and the associated redundancy addresses RADD) is typically limited.

Making reference to the example at issue, wherein each tile 210 of the memory array 110 comprises a respective packet of six redundant word lines RWL, and wherein the memory array 110 includes 128 tiles 210, the total number of available redundant word lines RWL is equal to 768. For the reasons previously described, the number of entries in the CAM memory 140 may be limited to the addresses ADD of defective memory cells MC corresponding to a small number of different word lines WL. For example, the maximum number of entries in the CAM memory 140 which can be programmed may correspond to the addresses ADD of defective memory cells MC corresponding to only 24 different word lines WL. Therefore, because of the constraints introduced by the particular implementation of the CAM memory 140, only a little portion of the redundant memory cells RMC of the memory array 110 may be employed for functionally replacing defective memory cells MC. In the example considered, even if the memory array 110 comprises 768 redundant word lines RWL—each one connected to a respective plurality of redundant memory cells RMC—, only the redundant memory cells RMC connected to 24 selected redundant word lines RWL may be used, because the CAM memory 140 is capable of storing the addresses ADD of defective memory cells MC (to be replaced) which are connected to at most 24 different word lines WL. If the defects are so serious to affect memory cells MC belonging to more than 24 word lines WL, the memory 100 is discarded.

In the solution according to an embodiment, as described in detail in the following, the redundant memory cells RMC that have not been used for functionally replacing defective memory cells MC may be used as storage elements for a protection register. This solution is achievable in almost all the integrated non-volatile memory devices, since, for the reasons described above, a great number of unused redundant memory cells is often available.

Figure 3:
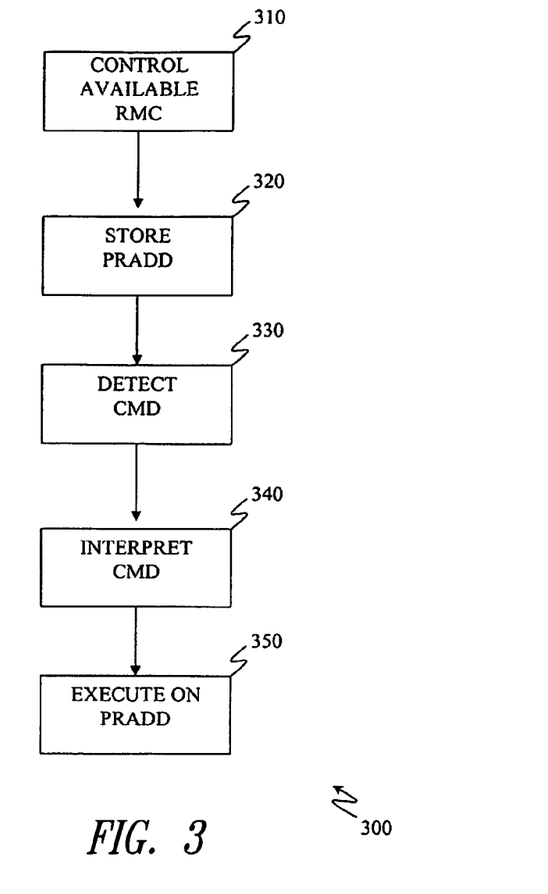
FIG. 3 illustrates a flow chart of the operations performed for implementing and using a protection register according to an embodiment.

Reference will be now made to FIG. 3, illustrating a flow chart 300 of the operations to be performed for implementing and using a protection register in the memory 100 according to an embodiment.

Particularly, after the test operations have been performed, and the (possible) defective memory cells MC of the memory array 110 have been functionally replaced by corresponding redundant memory cells RMC, a control is made on the memory array 110 to identify which among the redundant memory cells RMC in the memory array 110 have not been used (block 310). For example, a control is made to find the presence of unused redundant word lines RWL, i.e., whose redundant memory cells RMC has not be chosen for replacing any defective memory cell MC. Making reference to the memory array arrangement described in FIG. 2, a control is made in every plane 220 forming the memory array 110 to check whether the redundant memory cells RMC connected to a corresponding redundant word line RWL selected from the packet of redundant word lines RWL in each tile 210 of said plane 220 have been used for replacing memory cells MC or not.

According to an exemplary embodiment, in every plane 220 a control is made on the redundant memory cells RMC connected to the last redundant word line RWL of the packet of redundant word lines RWL in each tile 210 of said plane 220. The choice of controlling just the last redundant word line RWL in each packet of redundant word lines RWL is advantageous, since the selection of the redundant memory cells RMC for the replacement of defective memory cells MC is usually performed in a predetermined order, starting from the first redundant word line RWL of each packet, and then passing to the subsequent ones. Therefore, the last redundant word line RWL in each packet of redundant word lines RWL should probably result to be unused.

Having identified a number of unused redundant memory cells RMC that is sufficient to implement a protection register (whose size depends on the amount of data to be stored thereinto), the addresses identifying said memory cells RMC—referred to as protection register addresses PRADD—are stored in the CAM 140 of the redundancy control block 135 (block 320). Making reference to the exemplary embodiment considered before, each of said protection register addresses PRADD may correspond to the last (the sixth) redundant word line RWL of the packet of redundant word lines RWL in each tile 210 of a specific plane 220. Each protection address PRADD is stored into an empty entry of the CAM 140, together with an associated special address SADD. Similarly to the pairs address ADD/redundancy address RADD, a specific protection register address PRADD may be output by the redundancy block 135 in response to the reception of the special address SADD associated therewith. It has to be appreciated that the special addresses SADD stored in the CAM 140 are dedicated addresses that are different from the addresses ADD identifying any memory cell MC or redundant memory cell RMC of the memory array 110; for example, said special addresses SADD may include predetermined sequences of bits that are not included in the memory space of the memory array 110. In this way, it is assured that the redundant memory cells RMC identified by a protection register address PRADD—and thus, used as storage elements for a protection register—are not inadvertently accessed.

In order to access the protection register for reading or modifying information stored therein, a dedicated command CMD is provided to the main logic block 105. In detail, when the command interpreter circuit 112 detects that said received command CMD regards an operation to be performed on the protection register (block 330), a protection register interface circuit—identified in FIG. 1 with the reference 155—is accordingly activated. For example, said operation to be performed on the protection register may be a request to read a factory device identifier or to modify a password.

Based on the received command CMD, the protection register interface circuit 155 interprets the operation to be performed on the protection register (block 340). Particularly, the protection register interface circuit 155 is configured to output a particular special address SADD based on the specific command CMD received by the main logic block 105, and particularly based on which part of the protection register is the object of said command. For example, a first special address SADD may correspond to the portion of the protection register devoted to store the factory device identifiers of the memory, a second one may correspond the portion of the protection register devoted to store the passwords, and so on.

The special address SADD output by the protection register interface circuit 155 is provided to the redundancy control block 135, which accordingly outputs a CAM address CADD having a value that corresponds to the protection register address PRADD associated with the special address SADD. Therefore, in the same way as the case of defective cells, the redundancy matching block 150 drives the multiplexer 145 through the flag signal FLAG in such a way that the internal address INTADD is set to the CAM address CADD. In this way, the operation corresponding to the received command CMD is performed on the redundant memory cells RMC identified by the protection register address PRADD (block 350).

Therefore, instead of implementing the protection register by means of a dedicated mini-array separated from the memory array 110, according to the proposed solution the protection register is advantageously implemented through the reallocation of a group of redundant memory cells RMC. Since the number of unused redundant memory cells RMC available to be employed for implementing the protection register in a memory array of a generic non-volatile memory is typically large, the amount of data that can be stored in the protection register is not limited by the area occupation constraints affecting the known solutions.

Moreover, according to the present solution the protection register may be accessed both in reading and in writing using the same read and write circuit 130 used for reading and writing data from/into the (standard) memory cells MC of the memory array 110.

According to an embodiment, the protection register interface circuit 155 is also capable of warning the redundancy matching block 150 of possible unauthorized attempts to access the protection register through a warning flag signal WF. For example, if the received command have been provided to the main logic block 105 in a correct way—e.g., in conjunction with an ordered bit sequence known by authorized users only—the warning flag signal WF is deasserted, and the operations performed by the redundancy matching block 150 are not affected. On the contrary, in case the received command is not correct, the warning flag signal WF is asserted, and the redundancy matching block 150 bans the access to the addressed redundant memory cells RMC, for example driving the multiplexer 145 through the flag signal FLAG in such a way that the output of the multiplexer switches into a high-impedance condition.

Figure 4:
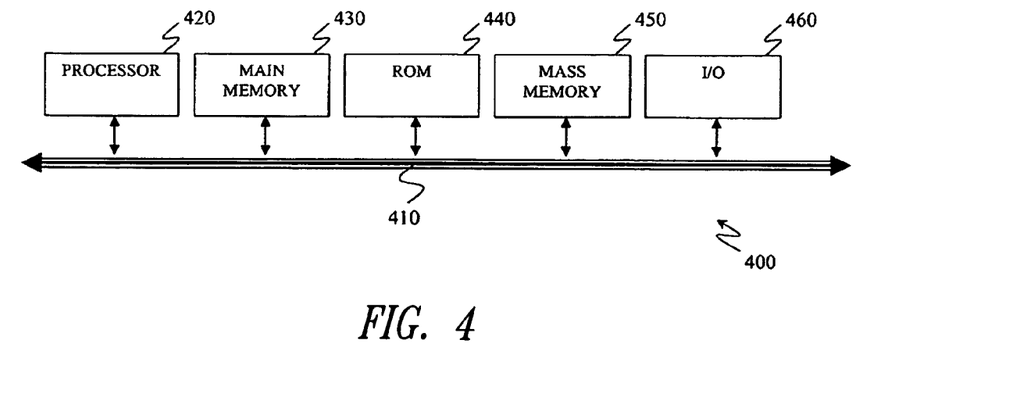
FIG. 4 schematically illustrates a portion of an exemplary electronic system according to one embodiment.

FIG. 4 schematically illustrates a portion of an exemplary electronic system 400 according to an embodiment. The electronic system 400 may be for example a computer, a personal digital assistant (PDA), a laptop or portable computer, a digital music player, a digital camera, or other devices that may be configured to exploit an integrated non-volatile memory device.

The electronic system 400 is formed by several units that are connected in parallel to a system or communication bus 410 (with a structure that is suitably scaled according to the actual function of the system 400). In detail, one or more processors 420 control operation of the system 400; a main memory 430 is directly used as a working memory by the processors 420, and a ROM 440 stores basic code for a bootstrap of the system 400. Moreover, the system 400 is provided with a mass memory 450 for storing data and programs, and input/output units 460 for receiving/providing data from/to the outside.

The system 400 may exploit the advantages of the proposed solution by implementing the ROM 440 and/or the mass memory 450 with at least one non-volatile memory such as the memory 100 discussed herein.

Naturally, a person skilled in the art may apply to the solution described above many logical and/or physical modifications and alterations. More specifically, although the present disclosure describes with a certain degree of particularity some embodiments, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, the proposed solution may be implemented with an equivalent method (using similar steps, removing non-essential steps or adding optional steps).

Even if reference has been made to the phase change memory field, the concepts of the present disclosure can be applied to other types of non-volatile memories, such as erasable and programmable read-only memories, flash memories, and the like.

Similar considerations apply if the memory array has a different structure, with the memory cells that are arranged in a different way, for example with each plane that includes a single tile, or with the memory array that is divided into partitions formed by groups of respective planes.

Moreover, even if in the present description the redundant memory cells of the memory array are connected to a respective packet redundant word lines in each tile, the concepts of the present invention apply to different arrangements; for example, the memory array may be provided with one or more redundant tiles that include redundant memory cells only.

The invention claimed is:

1. A non-volatile memory including:
   a plurality of memory cells configured to store data;
   a plurality of redundant memory cells configured to be used as replacements for defective memory cells of the plurality of memory cells;
   a protection register comprising storage elements configured to store configuration data of the memory, wherein the storage elements of the protection register are redundant memory cells of the plurality of redundant memory cells not currently being used as replacements for defective memory cells.

2. The non-volatile memory of claim 1, wherein the memory cells are identified by respective memory addresses and the redundant memory cells are identified by respective redundant addresses, the non-volatile memory further including:
   selection circuits configured to select a set of memory cells to be accessed based on a received memory address; and
   a redundancy management block configured to drive the selection circuits with a respective redundant memory address to select corresponding redundant memory cells if the received memory address identifies at least one defective memory cell, wherein said redundancy management block is further configured to associate the storage elements of the protection register with corresponding redundant addresses.

3. The non-volatile memory of claim 2, wherein said redundancy management block includes a redundancy management memory configured to store:
   a first set of redundant memory addresses including the redundant memory addresses that identify redundant memory cells functionally replacing defective memory cells; and
   a second set of redundant memory addresses including the redundant memory addresses that identify redundant memory cells used as storage elements of the protection register.

4. The non-volatile memory of claim 3, further including a protection register interface for receiving access requests to the protection register, and enabling the redundancy management block to drive the selection circuits with selected redundant memory addresses belonging to the second set based on the access requests.

5. The non-volatile memory of claim 4, wherein the redundancy management block includes an address multiplexer having a first input for receiving the memory addresses, a second input coupled with the redundancy management block for receiving the redundant memory addresses, a control input for receiving a flag signal, and an output for providing a selected one between a memory address or a redundant memory address to the selection circuits according to the flag signal, said flag signal being conditioned to the receipt of access requests to the protection register.

6. The non-volatile memory of claim 3, wherein the redundancy management memory is a one-time programmable memory.

7. The non-volatile memory of claim 1, wherein said memory cells and said redundant memory cells are phase change memory cells.

8. A method for managing a memory device, including:
   storing data into a plurality of memory cells;
   using a plurality of redundant memory cells as available replacements for defective memory cells of the plurality of memory cells;
   storing configuration data of the memory device into a plurality of storage elements of a protection register, wherein the storage elements of the protection register are redundant memory cells of the plurality of redundant memory cells not being currently used as replacements for defective memory cells.

9. The method of claim 8, wherein the memory cells are identified by respective memory addresses and the redundant memory cells are identified by respective redundant addresses, the method including:
   selecting a set of memory cells to be accessed based on a received memory address;
   selecting redundant memory cells if the received memory address identifies at least one defective memory cell; and
   associating the storage elements of the protection register with corresponding redundant addresses.

10. The method of claim 9, further including:
    storing a first set of redundant memory addresses including the redundant memory addresses that identify redundant memory cells functionally replacing defective memory cells; and
    storing a second set of redundant memory addresses including the redundant memory addresses that identify redundant memory cells used as storage elements of the protection register.

11. The method of claim 10, further including:
    receiving access requests to the protection register; and
    selecting redundant memory addresses belonging to the second set based on the access requests.

12. The method of claim 11, including:
accessing the non-volatile memory using a selected one between a memory address or a redundant memory address conditioned to the receipt of access requests to the protection register.

13. The method of claim 10, wherein the first and second sets of redundant memory addresses are stored in a one-time programmable memory.

14. The method of claim 8, wherein said memory cells and said redundant memory cells are phase change memory cells.

15. An electronic system, including:
a processor;
input/output units for receiving and providing data; and
a non-volatile memory that includes:
a plurality of memory cells configured to store data;
a plurality of redundant memory cells configured to be used as replacements for defective memory cells of the plurality of memory cells;
a protection register comprising storage elements configured to store configuration data of the memory, wherein the storage elements of the protection register are redundant memory cells of the plurality of redundant memory cells not currently being used as replacements for defective memory cells;
a redundancy management block coupled to the plurality of redundant memory cells;
a protection register interface coupled to the redundancy management block, the redundancy management block including a memory configured to store the addresses of the storage elements of the protection register and the protection register interface configured to receive a command to access the storage elements of the protection register; and
a redundancy matching block coupled to the protection register interface and the redundancy management block, the a redundancy matching block configured to receive a warning flag from the protection register interface if unauthorized attempts to access the protection register are made through the protection register interface.

16. The system of claim 15, wherein the memory cells are identified by respective memory addresses and the redundant memory cells are identified by respective redundant addresses, the non-volatile memory further including:
selection circuits configured to select a set of memory cells to be accessed based on a received memory address; and
wherein the redundancy management block is configured to drive the selection circuits with a respective redundant memory address to select corresponding redundant memory cells if the received memory address identifies at least one defective memory cell, wherein said redundancy management block is further configured to associate the storage elements of the protection register with corresponding redundant addresses.

17. The system of claim 16, wherein said redundancy management block includes a redundancy management memory configured to store:
a first set of redundant memory addresses including the redundant memory addresses that identify redundant memory cells functionally replacing defective memory cells; and
a second set of redundant memory addresses including the redundant memory addresses that identify redundant memory cells used as storage elements of the protection register.

18. The system of claim 17, wherein the protection register interface is configured to enable the redundancy management block to drive the selector circuits with selected redundant memory addresses belonging to the second set based on the access requests.

19. The system of claim 18, wherein the redundancy management block includes an address multiplexer having a first input for receiving the memory addresses, a second input coupled with the redundancy management block for receiving the redundant memory addresses, a control input for receiving a flag signal, and an output for providing a selected one between a memory address or a redundant memory address to the selection circuits according to the flag signal, said flag signal being conditioned to the receipt of access requests to the protection register.

20. The system of claim 17, wherein the redundancy management memory is a one-time programmable memory.

21. The system of claim 15, wherein said memory cells and said redundant memory cells are phase change memory cells.

* * * * *

UNITED STATES PATENT AND TRADEMARK OFFICE
CERTIFICATE OF CORRECTION

| | | |
|---|---|---|
| PATENT NO. | : 8,064,278 B2 | Page 1 of 1 |
| APPLICATION NO. | : 12/346701 | |
| DATED | : November 22, 2011 | |
| INVENTOR(S) | : Chin-Tin Tina Yu et al. | |

It is certified that error appears in the above-identified patent and that said Letters Patent is hereby corrected as shown below:

Column 11, Line 37:
"block, the a redundancy matching block configured to" should read, --block, the redundancy matching block configured to--.

Signed and Sealed this
Twenty-first Day of February, 2012

David J. Kappos
*Director of the United States Patent and Trademark Office*